(12) United States Patent
Yoder et al.

(10) Patent No.: US 6,448,862 B1
(45) Date of Patent: Sep. 10, 2002

(54) SINGLE EVENT UPSET IMMUNE OSCILLATOR CIRCUIT

(75) Inventors: Joseph Yoder; Nadim Haddad, both of Oakton, VA (US)

(73) Assignee: BAE Systems Information and Electronic Systems Integration Inc., Rockville, MD (US)

( * ) Notice: Subject to any disclaimer, the term of this patent is extended or adjusted under 35 U.S.C. 154(b) by 0 days.

(21) Appl. No.: 09/667,040

(22) Filed: Sep. 21, 2000

(51) Int. Cl.[7] .................. H03K 3/354; H03B 27/00
(52) U.S. Cl. .................. 331/57; 331/34; 331/1 A; 327/176
(58) Field of Search ................. 331/57, 34, 1 A; 327/214, 215, 185, 176

(56) References Cited

U.S. PATENT DOCUMENTS 5,182,529 A * 1/1993 Chern .................. 331/57
6,005,448 A * 12/1999 Pickering et al. ........... 331/57

* cited by examiner

Primary Examiner—Arnold Kinkead
(74) Attorney, Agent, or Firm—Antony P. Ng; Bracewell & Patterson, L.L.P.

(57) ABSTRACT

A single event effect immune oscillator circuit is disclosed. The single event upset immune oscillator circuit includes an odd number of logic circuit blocks connecting in series to provide a continuous pulse signal at an output of the oscillator circuit. Each logic circuit block has a first input, a second input, and an output. For a series of logic circuit blocks i, where i=1 to n (n is an odd number), the output of a logic circuit block i is connected to a first input of a logic circuit block i+1. The output of the logic circuit block i is also connected to a first input of a logic circuit block i+x, wherein x is an odd number greater than one and less than or equal to n.

8 Claims, 5 Drawing Sheets

SINGLE EVENT UPSET IMMUNE OSCILLATOR CIRCUIT

BACKGROUND OF THE INVENTION

1. Technical Field

The present invention relates to electrical circuits in general, and in particular to oscillator circuits. Still more particularly, the present invention relates to a single event effect immune oscillator circuit.

2. Description of the Prior Art

Oscillator circuits are commonly found in clock generation circuits, phase-locked loop circuits, and timing circuits. In environments having a relatively high-level of radiation, such as satellite orbital space, electronic devices that utilize oscillator circuits are more susceptible to single event effects (SEEs). These SEEs are typically caused by electron-hole pairs created by, and travelling along the path of, a single energetic particle as it passes through the oscillator circuit. Should the energetic particle generate a critical charge within the diffusion node of the oscillator circuit, a false pulse will be generated at the output of the oscillator circuit.

Referring now to the drawings and in particular to FIG. 1, there is illustrated a schematic diagram of a typical oscillator circuit according to the prior art. As shown, an oscillator circuit 10 includes invertors 11a–11d and a two-input NAND gate 12, all connected in series. In this implementation, the output of invertor 11d also serves as the output for oscillator circuit 10. In addition, the pulse within oscillator circuit 10 can be turned off by de-asserting an enable input 13. For oscillator circuit 10, the diffusion nodes in each of invertors 11a–11d are very susceptible to SEEs. In order to reduce the susceptibility of oscillator circuit 10 to SEEs, very large n-channel and p-channel transistors are typically utilized to form invertors 11a–11d. While the effects of SEEs can be somewhat reduced with this approach, false pulses may still be generated by SEEs. Thus, the above-mentioned solution would not be acceptable for oscillator applications that are very sensitive to SEEs.

With reference now to FIG. 2, there is illustrated a schematic diagram of a SEE immune oscillator circuit, according to the prior art. Oscillator circuit 20 eliminates SEE transients by utilizing a redundancy scheme. As shown, oscillator circuit 20 includes three identical sets of oscillator circuits 20a–20c, each of which is similar to oscillator circuit 10 from FIG. 1. Output 23 from each of oscillator circuits 20a–20c are coupled to a voter 21. Voter 21 is designed to filter out any SEE transient pulses by allowing a pulse to occur at output 24 only if at least two of the input pulses at output 23 are identical. While oscillator circuit 20 having a voting scheme may eliminate SEE transient pulses at output 24, the circuit complexity is tripled due to the three-fold increase in the number of devices from oscillator circuit 10 of FIG. 1 and the added requirements of synchronization as well as phase issues among oscillator circuits 20a–20c. In addition, voter 21 itself may also be susceptible to SEEs.

Consequently, it is desirable to provide an improved oscillator circuit having a higher radiation tolerance. Radiation tolerance refers to the ability of an electronic device to withstand radiation without alteration of its electrical characteristics. An electronic device is said to be radiation tolerant if it can continue to function within specifications while experiencing SEEs.

SUMMARY OF THE INVENTION

In accordance with a preferred embodiment of the present invention, a single event effect immune oscillator circuit includes an odd number of logic circuit blocks connecting in series to provide a continuous pulse signal at an output of the oscillator circuit. Each logic circuit block has a first input, a second input, and an output. For a series of logic circuit blocks i, where i=1 to n (n is an odd number), the output of a logic circuit block i is connected to a first input of a logic circuit block i+1. The output of the logic circuit block i is also connected to a first input of a logic circuit block i+x, wherein x is an odd number greater than one and less than or equal to n.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
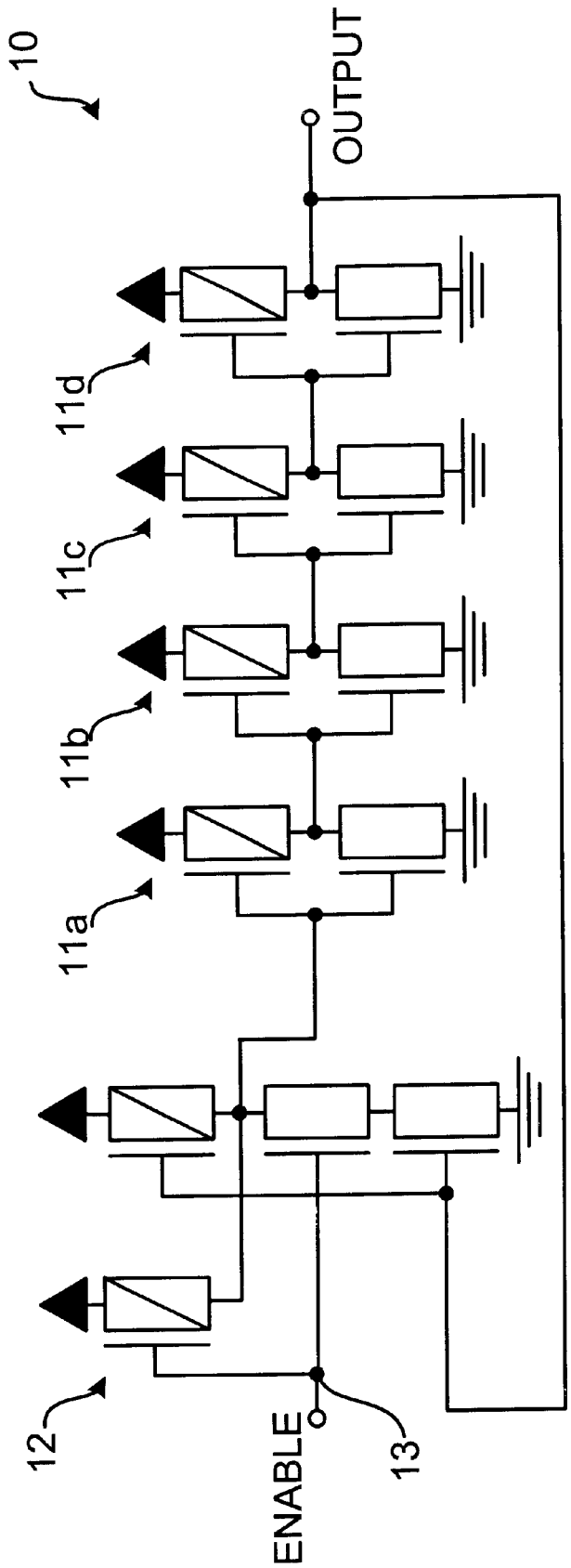
FIG. 1 is a schematic diagram of a typical oscillator circuit according to the prior art.
Figure 2:
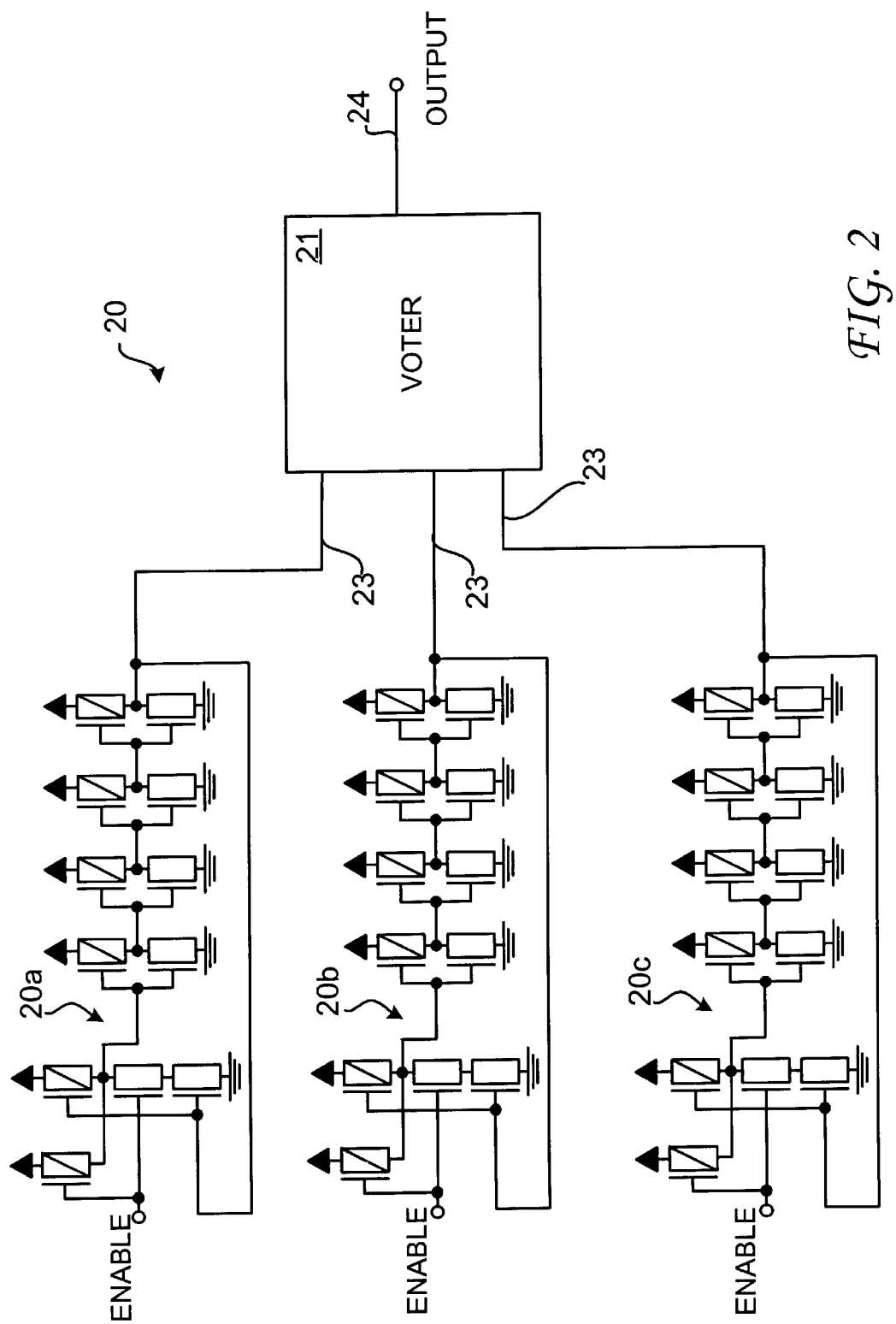
FIG. 2 is a schematic diagram of a single event effect immune oscillator circuit, according to the prior art.
Figure 3:
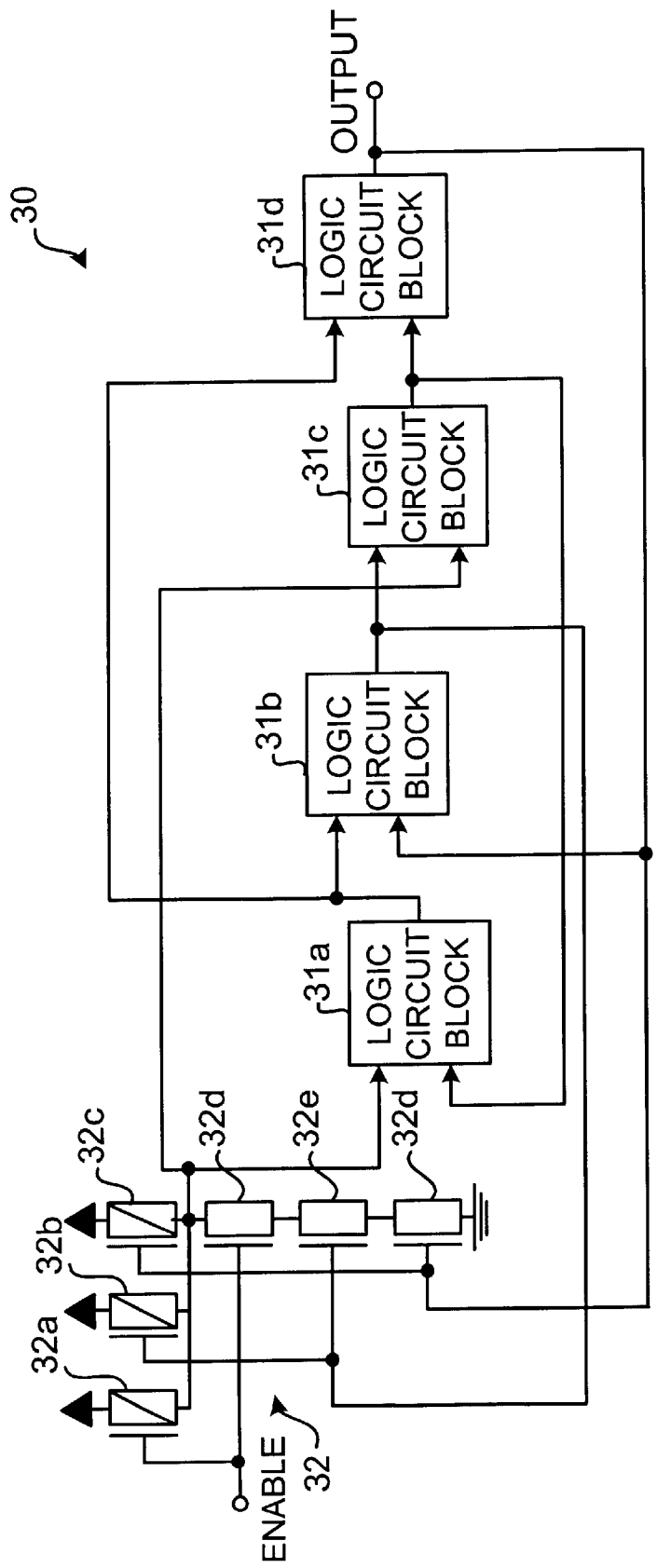
FIG. 3 is a schematic diagram of a single event effect immune oscillator circuit, in accordance with a preferred embodiment of the present invention.

Referring now to FIG. 3, there is illustrated a schematic diagram of a SEE immune oscillator circuit, in accordance with a preferred embodiment of the present invention. As shown, an oscillator circuit 30 includes logic circuit blocks 31a–31d and a three-input NAND gate 32. Three-input NAND gate 32 includes three p-channel transistors 32a–32c and three n-channel transistors 32d–32f. Each of logic circuit blocks 31a–31d has a first input, a second input, and an output. Logic circuit blocks 31a–31d and three-input NAND gate 32 are connected in series, or more specifically, in a ring configuration. In addition, logic circuit blocks 31a–31d are connected to each other in a staggered configuration. Specifically, the output of logic circuit block 31a is connected to the first input of logic circuit block 31b and the first input of logic circuit block 31d; the output of logic circuit block 31b is connected to the first input of logic circuit block 31c and the gate of transistor 32e; the output of logic circuit block 31c is connected to the second input of logic circuit block 31d and the second input of logic circuit block 31a; and, the output of logic circuit block 31d is connected to the gate of transistor 32f and the second input of logic circuit block 31b. In this implementation, the output of logic circuit block 31d also serves as the output of oscillator circuit 30.

Three-input NAND gate 32 provides a pulse control for oscillator circuit 30. For example, a pulse can be generated within oscillator circuit 30 by asserting an enable input 33, and the pulse can be turned off by de-asserting enable input 33. It is understood by those skilled in the relevant art that three-input NAND gate 32 can be replaced by a logic circuit block identical to one of logic circuit blocks 31a–31d if the above-mentioned pulse control function is not required. If such is the case, the first input for the replacement logic circuit block will be supplied by the output from logic circuit block 31b and the second input the replacement logic circuit block will be supplied by the output from logic circuit block 31d, and the output of the replacement logic circuit block will be sent to the first input of logic circuit blocks 31a and 31c.

In essence, an output of a logic circuit block is connected to a first input of an immediately subsequent logic circuit block, and a first input of another logic circuit block to provide a temporal separation. The choice of separation (as in how far apart) should be longer than the pulse width of a typical single event effect transient. For a series of logic circuit blocks i, where i=1 to n, and n is an odd number, the output of a logic circuit block i is preferably connected to a first input of a logic circuit block i+1 and a first input of a logic circuit block i+3. However, instead of the first input of the logic circuit block i+3, the output of the logic circuit block i can be connected to the first input of logic circuit block i+x, where x is an odd number greater than one but less or equal to n.

Figure 4C:
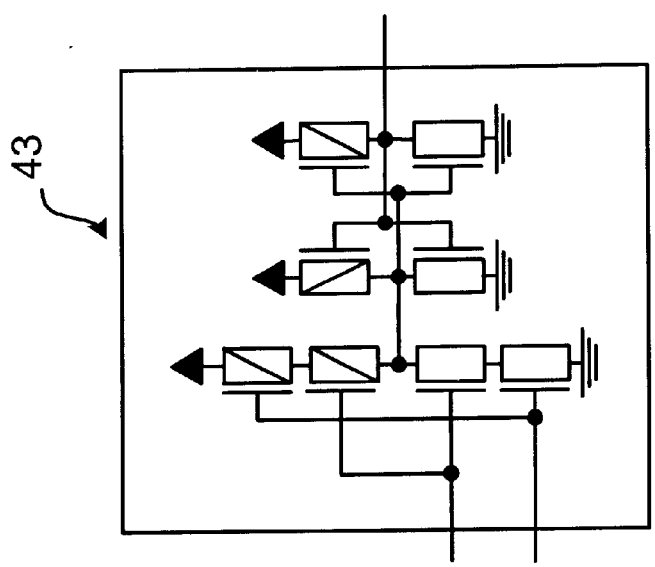
FIGS. 4a–4c are schematic diagrams for various types of logic circuit blocks that can be utilized within the oscillator circuit from FIG. 3, in accordance with a preferred embodiment of the present invention.
Figure 4B:
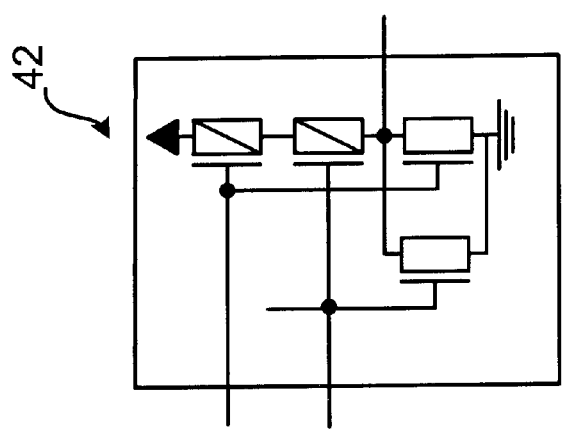
Figure 4A:
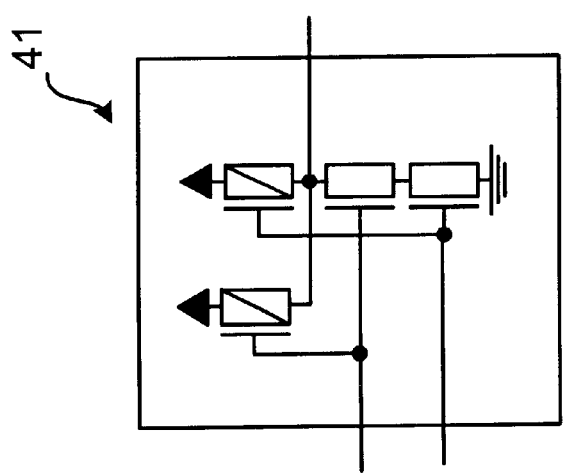

With reference now to FIGS. 4a–4c, there are illustrated schematic diagrams for various types of logic circuit blocks that can be utilized within oscillator circuit 30 from FIG. 3, in accordance with a preferred embodiment of the present invention. A two-input NAND gate 41 is shown in FIG. 4a, a two-input NOR gate 42 is shown in FIG. 4b, and a latch circuit 43 is shown in FIG. 4c. Any one of two-input NAND gate 41, two-input NOR gate 42, and latch circuit 43 can be served as logic circuit blocks 31a–31d within oscillator circuits 30. The choice is preferably dependent upon a certain application requirement.

For example, two-input NAND gate 41 rejects only positive going pulses because NAND gate 41 requires both of its inputs to be high for the output to switch low. When both inputs are low, a single input transitioning high will not cause the output of NAND gate 41 to switch. On other hand, two-input NOR gate 42 rejects only negative going pulses because NOR gate 42 requires both of its inputs to be low for the output to switch high. Thus, NOR gate 42 would have the converse property of NAND gate 41 for rejecting negative going pulses.

Oscillator circuit 30 can be made to reject both positive and negative going pulses by utilizing a logic circuit block that require both of its inputs to achieve the same value in order for its output to switch. This condition imposes a state dependency that will require the usage of a storage element or a latch circuit, such as latch circuit 43. Although latch circuit 43 is used as an example, it is understood by those skilled in the art that other storage element or latch circuit designs can also be used for this function. One main disadvantage of latch circuit 43 is that it could potentially lower the maximum oscillation frequency.

Figure 5:
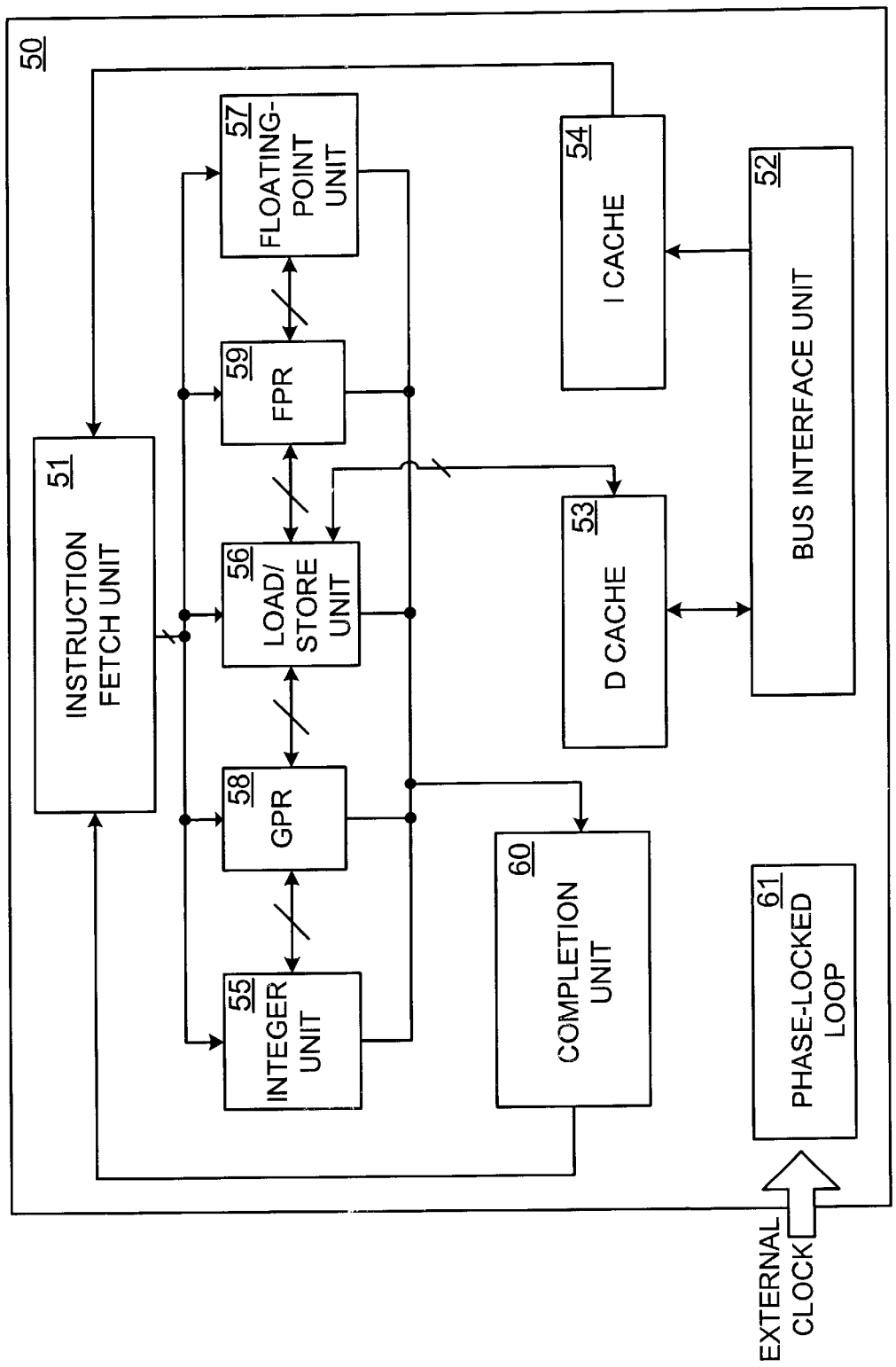
FIG. 5 is a block diagram of a processor in which the oscillator circuit from FIG. 3 can be incorporated.

Referring now to FIG. 5, there is depicted a block diagram of a processor in which oscillator circuit 30 can be incorporated. As shown, a processor 50 includes a phase-locked loop 61 for receiving clock signals from an external clock. Phase-locked loop 61, in turn, provides internal clock signals for various functional units within processor 50. Oscillator circuit 30 is preferably implemented within phase-locked loop 61. Within processor 50, a bus interface unit 52 is coupled to a data cache 53 and an instruction cache 54. Both data cache 53 and instruction cache 54 are high speed set-associative caches which enable processor 50 to achieve a relatively fast access time to a subset of data or instructions previously transferred from a main memory (not shown). Instruction cache 54 is further coupled to an instruction fetch unit 51 which fetches instructions from instruction cache 54 during each execution cycle.

Processor 50 also includes three execution units namely, an integer unit 55, a load/store unit 56, and a floating-point unit 57. Each of execution units 55–57 can execute one or more classes of instructions, and all execution units 55–57 can operate concurrently during each processor cycle. After execution has terminated, execution units 55–57 store data results to a respective rename buffer, depending upon the instruction type. Then, any one of execution units 55–57 signals a completion unit 60 that the instruction unit has been finished. Finally, instructions are completed in program order by transferring result data from the respective rename buffer to a general purpose register 58 or a floating-point register 59.

As has been described, the present invention provides an SEE immune oscillator circuit. The oscillator circuit of the present invention does not have any size restrictions on devices. Further, the oscillator circuit of the present invention does not require redundant sets of oscillators and does not introduce synchronization or phase issues. Each stage of the oscillator circuit is dependent on two inputs. By taking inputs at different points in the oscillator circuit, any short duration pulses that may be caused by single event effect transients can be rejected. The time duration of these pulses is determined by the delay between the two inputs to the oscillator circuit at a given stage and that delay is set by the number of stages between the tap points for the two inputs.

While the invention has been particularly shown and described with reference to a preferred embodiment, it will be understood by those skilled in the art that various changes in form and detail may be made therein without departing from the spirit and scope of the invention.

What is claimed is:

1. A single event effect immune oscillator circuit, comprising:

a plurality of latch circuit blocks i connected in series, wherein each of said plurality of latch circuit blocks i has a first input, a second input, and an output, wherein each of said plurality of latch circuit blocks changes from one state to another state only when input signals of identical polarity are contemporaneously received by both said first input and said second input, wherein each of said latch circuit blocks i includes a dual-input inverter and a storage cell, wherein i=1 to n, wherein n is an odd number; and an output of a latch circuit block i is connected to a first input of a latch circuit block i+1 and to a first input of a latch circuit block i+x, wherein x is an odd number higher than one and less than or equal to n.

2. The circuit according to claim 1, wherein said latch circuit blocks i are connected in a ring configuration.

3. The circuit according to claim 1, wherein said storage cell includes four cross-coupled transistors.

4. The circuit according to claim 1, wherein one of said latch circuit blocks i is a three-input NAND gate.

5. A processor, comprising:

a plurality of execution units;

a phase-locked loop circuit coupled to said plurality of execution units, wherein said phase-locked loop circuit includes an oscillator circuit having:

a plurality of latch circuit blocks i connected in series, wherein each of said plurality of latch circuit blocks i has a first input, a second input, and an output, wherein each of said plurality of latch circuit blocks changes from one state to another state only when input signals of identical polarity are contemporaneously received by both said first input and said second input, wherein each of said latch circuit blocks i includes a dual-input inverter and a storage cell, wherein i=1 to n, wherein n is an odd number; and an output of a latch circuit block i is connected to a first input of a latch circuit block i+1 and to a first input of a latch circuit block i+x, wherein x is an odd number higher than one and less than or equal to n.

6. The processor according to claim 5, wherein said latch circuit blocks i are connected in a ring configuration.

7. The processor according to claim 5, wherein said storage cell includes four cross-coupled transistors.

8. The processor according to claim 5, wherein one of said latch circuit blocks i is a three-input NAND gate.

* * * * *

UNITED STATES PATENT AND TRADEMARK OFFICE
CERTIFICATE OF CORRECTION

PATENT NO.    : 6,448,862 B1
DATED         : September 10, 2002
INVENTOR(S)   : Joseph Yoder et al.

It is certified that error appears in the above-identified patent and that said Letters Patent is hereby corrected as shown below:

<u>Column 6,</u>
Line 5, after the word "The" please change "processor" to -- circuit --.

Signed and Sealed this

Fifth Day of August, 2003

JAMES E. ROGAN
*Director of the United States Patent and Trademark Office*